United States Patent [19]

Ito

[11] Patent Number: 4,903,019

[45] Date of Patent: Feb. 20, 1990

[54] SAMPLING FREQUENCY CONVERTER FOR CONVERTING A LOWER SAMPLING FREQUENCY TO A HIGHER SAMPLING FREQUENCY AND A METHOD THEREFOR

[75] Inventor: Nobuo Ito, Inazawa, Japan

[73] Assignee: Sanyo Electric Co., Ltd., Japan

[21] Appl. No.: 235,231

[22] Filed: Aug. 23, 1988

[30] Foreign Application Priority Data

Aug. 31, 1987 [JP] Japan .................. 62-218523

[51] Int. Cl.$^4$ .............................. H03M 7/30
[52] U.S. Cl. ...................................... 341/61
[58] Field of Search .................... 341/61, 50

[56] References Cited

U.S. PATENT DOCUMENTS

| | | | |
|---|---|---|---|
| 4,109,110 | 8/1978 | Gingell | 341/61 |
| 4,460,890 | 7/1984 | Busby | 341/61 |
| 4,536,745 | 8/1985 | Yamaguchi et al. | 341/61 |
| 4,630,034 | 12/1986 | Takahashi | 341/106 |
| 4,684,925 | 8/1987 | Maruta | 341/166 |

Primary Examiner—William M. Shoop, Jr.
Assistant Examiner—Sharon D. Logan
Attorney, Agent, or Firm—Peter L. Michaelson

[57] ABSTRACT

A converter converts time-sequential input digital data $Q_i$ having a sampling frequency $f_m$ to time-sequential digital data $P_j$ having a sampling frequency $f_n$ ($f_n:f_m=n:m$, $n>m$, n, m; an integer), which comprises a time axis compressing converter 6 receiving the time-sequential input digital data $Q_i$, adding $(n-m)$ dummy data $D_K$ every m received input data $Q_i$ and outputting the combined data at the frequency $f_n$ and a single transversal type digital filter 12 for performing filter processing on output data from the time-axis compressing converter 6 in which tap coefficient data $\beta_k$ is switch at the cycle of $1/f_n$. The tap coefficient data is selected to nullify dummy data $D_K$ which periodically appears, based on impulse response data obtained by sampling a sampling function for the sampling frequency $f_m$ with a frequency of the least common multiple of the sampling frequencies $f_n$ and $f_m$.

9 Claims, 6 Drawing Sheets

SAMPLING FUNCTION

RECOVERY OF BAND LIMITED WAVE FORM

TIME REGION

FREQUENCY REGION

CONVERSION FROM 3fsc TO 4fsc (c) FREQUENCY CHARACTERISTICS OF AN INTERPOLATING FILTER
— 25 TAP
--- 13 TAP

SAMPLING FREQUENCY CONVERTER FOR CONVERTING A LOWER SAMPLING FREQUENCY TO A HIGHER SAMPLING FREQUENCY AND A METHOD THEREFOR

BACKGROUND OF THE INVENTION

1. Field of the Invention

The present invention relates generally to sampling frequency converters, and more particularly, to a sampling frequency converter receiving digital data sampled at a given sampling rate for converting the same to digital data sampled at a higher sampling rate and a method therefor.

2. Description of the Prior Art

Digital processing of signals has some advantages, such as smaller dependency on characteristics of devices and/or elements and facility of various processing of signals, as compared to analog processing. On the other hand, in the technical fields of video apparatus and units and audio apparatus and units, it is desired that analog video signals and analog audio signals are converted to digital data to perform various signal processing in order to improve a reproduced image and a reproduced voice and sound in quality. In order to meet such a requirement, digital video apparatus and units such as a digital television receiver and a digital video tape recorder and digital audio apparatus and units such as a compact disc player and a digital audio tape recorder have been devised and put into practice.

However, in these kinds of digital video apparatus and units and digital audio apparatus and units, different sampling frequencies are used in converting an analog signal to digital data in different apparatus and units or manufacturers. For example, in digital television receivers, a sampling frequency $f_s$ of color TV signals is selected to be $3f_{sc}$ or $4f_{sc}$ in many cases, where $f_{sc}$ denotes a frequency of a chrominance subcarrier of approximately 3.58 MHz. As the kind and the number of such digital apparatus and units are increased, the connection between the apparatus and units each having different sampling frequencies $f_s$ provides a problem to be solved. More specifically, as shown in FIG. 1, when a device A processes data having a sampling rate or frequency $f_n$ while a device B processes data having a sampling rate or frequency $f_m$, it is necessary that a sampling rate (sampling frequency) of output (or input) data coincides with a sampling rate of a supplying unit (or receiving unit) in order to supply and receive data between the devices A and B. Thus, a sampling frequency converter C must be provided between the devices A and B. Description is now made on the principle of an operation and the structure of a conventional sampling frequency converter.

It is assumed that a one dimensional signal $g(t)$ limited to a band W or less has a frequency spectrum shown in FIG. 2(a). According to the sampling theorem, if sample values ..., $g(-2T)$, $g(-T)$, $g(0)$, $g(T)$, $g(2T)$, ... sampled at the interval of $T=1/(2W)$, that is, sampled with a sampling frequency of $f_s=2W$, are given, the original signal $g(t)$ can be completely recovered from the following equation (1):

$$g(t) = \sum_{i=-\infty}^{\infty} g(iT)S(t - iT) \tag{1}$$

where, $T = 1/(2W)$, $$S(t) = \frac{\sin 2\pi W t}{2\pi W t}$$

A sampling function $S(t)$ indicates an output generated when an impulse is applied to an ideal low pass filter having the band W.

FIG. 3 shows the sampling function $S(t)$ and one example of a band limited waveform recovered in accordance with the equation (1).

Since a function (FIG. 2(c)) composed of only sample values is given by the product of the original signal $g(t)$ (FIG. 2(a)) and a one dimensional Comb function $\sum \delta(t-iT)$ (FIG. 2(b)), as shown in FIG. 2(c), the function can be expressed as:

$$g(t) \cdot \sum \delta(t - iT) \tag{2}$$

If Fourier transform is performed on the expression (2), then:

$$\mathcal{F}\{g(t) \cdot \Sigma \delta(t - iT)\} = \tag{3}$$

$$G(f) \otimes \frac{1}{T} \sum_{k=-\infty}^{\infty} \delta\left(f - \frac{k}{T}\right) =$$

$$\frac{1}{T} \sum_{k=-\infty}^{\infty} G\left(f - \frac{k}{T}\right),$$

$\otimes$ in the above equation (3) denotes convolution. The spectrum distribution of the equation (3) is shown in FIG. 2(d).

Consideration will be given to a case in which time-sequential digital data $Q_0, Q_1, Q_2, \ldots$ obtained by sampling the original signal $g(t)$ with a sampling frequency $3f_{sc}$ are digitally processed to be converted to time-sequential data $P_0, P_1, P_2, \ldots$ obtained by sampling the original signal $g(t)$ with a sampling frequency $4f_{sc}$, as shown in FIG. 4. In this case, theoretically, setting the respective sample data $Q_0, Q_1, Q_2, \ldots$ to $g(0), g(T), g(2T), \ldots$ (where $T=1/(3f_{sc})$), to be substituted in the equation (1), then $g(t)$ is represented as follows:

$$g(t) = \Sigma Q_i S(t - iT) \tag{1}'$$

Then, if the times at which the sample data $P_0, P_l, P_2$, are obtained, i.e., $0, T', 2T', \ldots$ (where $T'=1/(4f_{sc})$) are substituted in the equation (1)', sample data $P_0, P_1, P_2, \ldots$ having the sampling frequency $4f_{sc}$ are obtained. However, the above described operation with an original sampling frequency and a sampling frequency after conversion being set to arbitrary values, respectively, is almost impossible and is not practical from a point of view of circuit configuration or the like because the operation includes an infinite number of times of product and addition.

On the other hand, when the original sampling frequency $f_m$ and the sampling frequency $f_n$ after conversion satisfy the integral ratio of m:n, the original data $Q_i$ and the data $P_j$ after conversion have a particular phase relation, so that the conversion can be simplified, which is described in, for example, an article by M. Achiba, entitled "An approach for digitally converting a sampling frequency for NTSC signals", IECE Japan Precedings of National Conference, March 1979, the lecture No. 1080.

More specifically, as shown in FIG. 4, considering a case in which the sampling frequency $3f_{sc}$ is converted to the sampling frequency $4f_{sc}$, if the data $Q_i$ is interpolated by an interpolating filter which operates at the rate of the least common multiple $12f_{sc}$ of the sampling frequencies $3f_{sc}$ and $4f_{sc}$ to convert the sampling frequency $3f_{sc}$ to the sampling frequency $12f_{sc}$ and then, the interpolated data $Q_i'$ is further resampled with the sampling frequency $4f_{sc}$, then the data $P_j$ after conversion is obtained. When data obtained by sampling a sampling function of $T=1/(3f_{sc})$ with the sampling frequency $12f_{sc}$ are represented by $S_h$ ($h=0, \pm 1, \pm 2, \ldots$) as shown in FIG. 4($a$), the following equation (4) is obtained as a general expression between the original data $Q_i$ and the data after conversion $P_j$, based on the particular phase relation ($P_{4k}=Q_{3k}$):

$$\left.\begin{aligned} P_{4k} &= \sum_{l=-\infty}^{\infty} S_{4l} \cdot Q_{3k+l} \\ P_{4k+1} &= \sum_{l=-\infty}^{\infty} S_{4l-3} \cdot Q_{3k+l} \\ P_{4k+2} &= \sum_{l=-\infty}^{\infty} S_{4l-6} \cdot Q_{3k+l} \\ P_{4k+3} &= \sum_{l=-\infty}^{\infty} S_{4l-9} \cdot Q_{3k+l} \end{aligned}\right\} \quad (4)$$

where $S_h$ denotes an impulse response of the ideal low pass filter (which operates at the rate of frequency $12f_{sc}$) having the band W ($=\frac{1}{2}T=3/2f_{sc}$), which is given by the following equation, as described above (see the equation (1)):

$$S(t) = \frac{\sin 2\pi Wt}{2\pi Wt} = \frac{\sin(3\pi f_{sc}t)}{3\pi f_{sc}t} \quad (5)$$

$$\text{Thus, } S_h = S\left(\frac{h}{12f_{sc}}\right) = \frac{\sin\left(\frac{\pi}{4}h\right)}{\frac{\pi h}{4}}$$

where $S_0=1$.

As clearly seen from the equation (4), conversion of the sampling frequency from $3f_{sc}$ to $4f_{sc}$ is performed by structuring the interpolating filter using four kinds of transversal type digital filers shown in the equation (4).

As shown in FIG. 5, the transversal type filter generally comprises a plurality of delay elements D connected in series, coefficient circuits C each for multiplying an output of each of the delay elements by a predetermined constant (tap coefficient) $\alpha_1$ to $\alpha_{n-1}$, and an adder S for summing up an output of each of the coefficient circuits.

Thus, assuming that the delay time $Z^{-1}$ of each of the delay elements D is $1/(3f_{sc})$ and the 4 kinds of tap coefficients $\alpha_1$ to $\alpha_{n-1}$ of the coefficient circuits C are $\{S_{4l}\}$, $\{S_{4l-3}\},\{S_{4l-6}\}$ and $\{S_{4l-9}\}$, respectively, converted data $\{P_{4k}\}$, $\{P_{4k+1}\}$, $\{P4k+2\}$ and $\{P_{4k+3}\}$ can be obtained from 4 kinds of filters, respectively. Thus, if such digital filters $1a$ to $1d$ are provided in parallel as shown in FIG. 6 and outputs of the digital filers $1a$ to $1d$ are sequentially switched at the rate of the frequency $4f_{sc}$, a converted data stream $P_j$ of the sampling frequency $4f_{sc}$ is obtained. In FIG. 6, a terminal 3 receives the original data stream $Q_i$. The digital filter $1a$ has the tap coefficient $\{S_{4l}\}$ and outputs the converted data $P_{4k}$. The filter $1b$ has the tap coefficient $\{S_{4l-3}\}$ and outputs the converted data $P_{4k+1}$. The digital filter $1c$ has the tap coefficient $\{S_{4l-6}\}$ and outputs the converted data $P_{4k+2}$. The digital filter $1d$ has the tap coefficient $\{S_{4l-9}\}$ and outputs the converted data $P_{4k+3}$. A switch 2 sequentially switches the filters $1a$ to $1d$ at the rate of the frequency $4f_{sc}$, to supply an output from a selected filter to an output terminal 4.

If an infinite number of times of addition is performed to find the converted data $P_j$ as in the above equation (4), ideal conversion is achieved, so that exact converted data is obtained. However, performing an infinite number of times of addition is impossible on an actual circuit because it means that an infinite number of delay elements D and coefficient circuits C are provided in, for example, the structure shown in FIG. 5. The number of times of addition in the filers $1a$ to $1d$ are generally determined from frequency characteristics of the interpolating filter based on required accuracy for a filter, or the like.

On the other hand, if considered in a frequency region, the interpolating filters $1a$ to $1d$ are low pass filters for removing higher harmonic components caused by sampling of $f_s=3f_{sc}$ and eliminating components folded into a base band caused by resampling at the rate of $f_s=4f_{sc}$, as shown in FIGS. 7A and 7B. In color TV signals, since the spectral luminous efficacy in the vicinity of a direct current and $f_{sc}$ region is high, gain in a frequency which is integral multiple of $f_{sc}$ must be strictly suppressed. The above described interpolating filters theoretically operate at the rate of the frequency $12f_{sc}$, so that it is required for the filters to considerably suppress characteristics in $f=n'f_{sc}$ ($n'=0, 1, 2, \ldots, 6$). This is achieved by a frequency sampling filter.

A frequency characteristic $H_1(f)$ of a transversal filter of linear phase having $(2N+1)$ impulse responses $h_i$ is given by the following equation (7):

$$H_1(f) = \left\{ h_0 + 2\sum_{i=1}^{N} h_i\cos(2\pi fTi) \right\} \times \exp(-j2\pi fTN) \quad (7)$$

where $h_i=h_{-i}$ Assuming that the sampling frequency is $12f_{sc}$ in the equation (7), the following equation is obtained:

$$H_1(f) = h_0 + 2\sum_{k=1}^{N} h_k\cos(k f\pi/6f_{sc}) \quad (7)'$$

Here, the exponential component is removed in the expression (7') for convenience. Thus, the filter, in which the above described frequency characteristic $H_1(f)$ is 1 for $f=0$, $f_{sc}$ while being 0 for $f=2f_{sc}, 3f_{sc}, \ldots, 6f_{sc}$, can be structured from the above equation (7)' by a transversal filter having 13 taps in which N is a minimum of 6, i.e., a sampling interval of a frequency is $f_{sc}$ (represented by a broken line in FIG. 4C). On the other hand, when a 25th order transversal filter having 25 taps (impulse responses) in which the sampling interval is $f_{sc}/2$ is required, the filter is found from a simultaneous equation of 25 elements such that $N=12$ in the equation (7)' (because $h_i=h_{-i}$ is also a condition) (see FIG. 7C).

When an impulse response $S_k$ of the transversal filter having 25 taps is calculated by using the above described simultaneous equation of 25 elements, the following equation (8) is obtained as an equation corresponding to the equation (4):

$$P_{4k} = \sum_{l=3}^{3} S_{4l} \cdot Q_{3k+l}$$

$$P_{4k+1} = \sum_{l=-2}^{3} S_{4l-3} \cdot Q_{3k+l}$$

$$P_{4k+2} = \sum_{l=-1}^{4} S_{4l-6} \cdot Q_{3k+l}$$

$$P_{4k+3} = \sum_{l=0}^{5} S_{4l-9} \cdot Q_{3k+l}$$

(8)

The above equation (8) is obtained if the phase relation in the equation (4) is considered in impulse responses $S_{-12}$ to $S_{12}$. When the equation (8) is expressed by a determinant, the following equation (9) is obtained:

$$\begin{bmatrix} P_{4k} \\ P_{4k+1} \\ P_{4k+2} \\ P_{4k+3} \end{bmatrix} = \begin{bmatrix} S_{-12} & S_{-8} & S_{-4} & S_0 & S_4 & S_8 & S_{12} & 0 & 0 \\ 0 & S_{-11} & S_{-7} & S_{-3} & S_1 & S_5 & S_9 & 0 & 0 \\ 0 & 0 & S_{-10} & S_{-6} & S_{-2} & S_2 & S_6 & S_{10} & 0 \\ 0 & 0 & 0 & S_{-9} & S_{-5} & S_{-1} & S_3 & S_7 & S_{11} \end{bmatrix} \begin{bmatrix} Q_{3k-3} \\ Q_{3k-2} \\ Q_{3k-1} \\ Q_{3k} \\ Q_{3k+1} \\ Q_{3k+2} \\ Q_{3k+3} \\ Q_{3k+4} \\ Q_{3k+5} \end{bmatrix}$$

(9)

Thus, as obvious from the equation (9), the filters 1a to 1d can be structured by a seventh or sixth order transversal filter having as tap coefficients $[S_{-12}, S_{-8}, \ldots, S_8, S_{12}]$, $[S_{-11}, S_{-7}, \ldots, S_5, S_9]$, $[S_{-10}, S_{-6}, \ldots, S_6, S_{10}]$ and $[S_{-9}, S_{-5}, \ldots, S_7, S_{11}]$, respectively.

FIG. 8 shows one example of an impulse response (tap coefficient) of the 25th order transversal filter for converting the sampling frequency from $3f_{sc}$ to $4f_{sc}$ and respective tap coefficients of the digital filters 1a to 1d.

As described above, in the conventional sampling frequency converter, when the original sampling frequency $f_m$ and the sampling frequency $f_n$ after conversion are in the integral ratio of m:n, conversion from the sample data $Q_i$ of the sampling frequency $f_m$ to the sample data $P_j$ of the sampling frequency $f_n$ is performed based on the impulse response data $S_h$ obtained by sampling the sampling function of $T = 1/f_m$ with a frequency which is the least common multiple of the frequencies $f_m$ and $f_n$. In the actual circuit configuration, under consideration of frequency response characteristics of the filter, or the like, a sampling frequency converter is structured by using a parallel body of n transversal type digital filters and switching means sequentially and selectively passing outputs of the filters, which operate at the rate of the frequency $f_n$, as expressed by the equation (9).

However, in the conventional structure, n digital filters are required. Thus, the number of parts constituting a sampling frequency converter is increased, so that the circuit configuration becomes complicated and expensive.

SUMMARY OF THE INVENTION

An object of the present invention is to provide a low-cost sampling frequency converter having a reduced number of parts and a simple circuit configuration.

Another object of the present invention is to achieve a converter for converting a low sampling frequency to a high sampling frequency in a simple circuit configuration and at a low cost.

Still another object of the present invention is to provide a method for converting a sampling frequency.

The sampling frequency converter according to the present invention comprises time axis compression means receiving sequential digital data $Q_i$ formed with a sampling frequency $f_m$ for adding (n−m) meaningless dummy data, to the received data every time the number of the received sequential digital data $Q_i$ becomes m and reading out the same at the rate of a frequency $f_n$ (n>m, $f_m:f_n=m:n$) and interpolating means, which operate at the rate of the frequency $f_n$, receiving outputs from the time axis compression means for performing predetermined interpolating filter processing. The interpolating means comprises means for storing predetermined n kinds of tap coefficients and means for sequentially reading out different kind of tap coefficients from the storing means, and one transversal type digital filter for filtering the supplied sequential data including dummy data based on the tap coefficients. The tap coefficients are set to nullify the added dummy data.

In the above described structure, data having the sampling frequency $f_m$ is converted to data having the sampling frequency $f_n$ by adding (n−m) dummy data thereto. The dummy data are periodically applied to the filter. However, the dummy data are nullified by suitably selecting tap coefficients. In addition, n kinds of tap coefficients are sequentially and circulatingly switched at the rate of the frequency $f_n$ (cycle $T = 1/f_n$). Thus, conversion from the sampling frequency $f_m$ to the sampling frequency $f_n$ can be made by a single digital filter.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram showing frequency characteristics required for interpolating filters used in the sampling frequency converter, where

DESCRIPTION OF THE PREFERRED EMBODIMENTS

Figure 9:
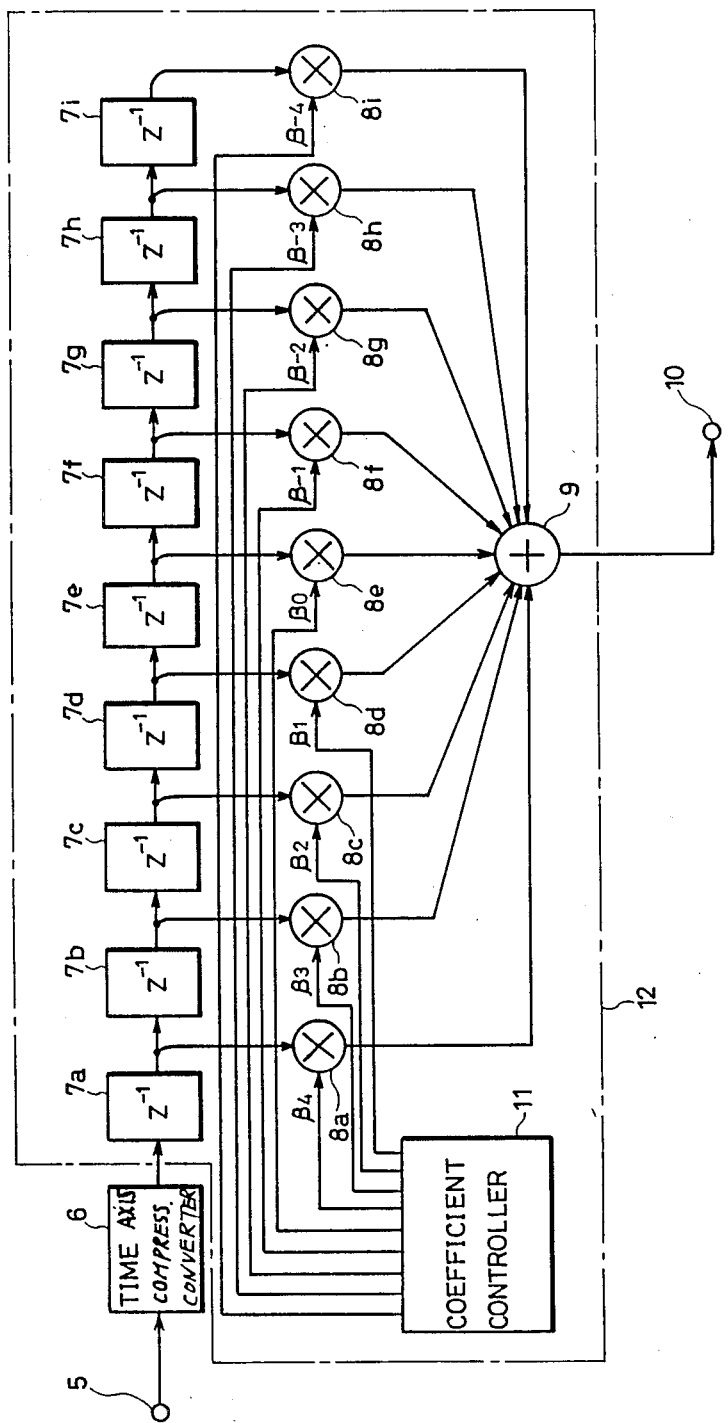
FIG. 9 is a diagram showing schematically a structure of a sampling frequency converter according to one embodiment of the present invention.

FIG. 9 is a diagram showing a structure of a sampling frequency converter according to one embodiment of the present invention. FIG. 9 shows, as an example, a structure applied to a case in which the original sampling frequency $f_m$ and a sampling frequency $f_n$ after conversion are $3f_{sc}$ and $4f_{sc}$, respectively.

Referring now to FIG. 9, the sampling frequency converter according to one embodiment of the present invention comprises a time axis compressing converter 6 sequentially receiving digital data $Q_i$ sampled with a frequency $3f_{sc}$, adding one dummy data $D_K$ every time it receives three data $Q_i$ and outputting the combined data at the rate of a frequency $4f_{sc}$ and a transversal type digital filter 12 for performing predetermined filter processing on an output from the time axis compressing converter 6 to output converted digital data $P_j$ having the sampling frequency $4f_{sc}$.

Figure 10:
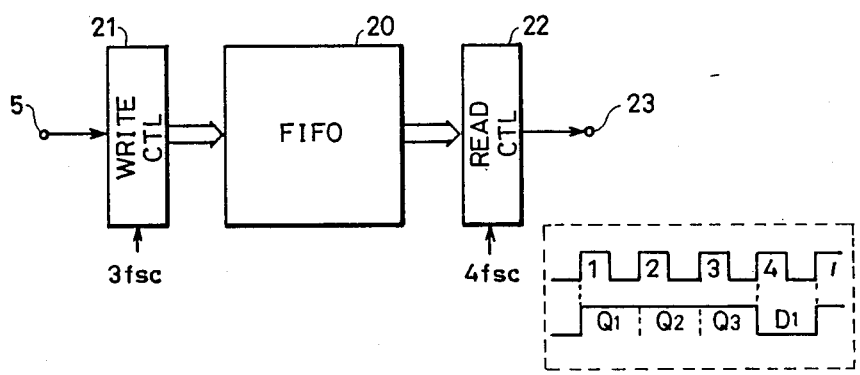
FIG. 10 is a diagram showing schematically an example of a structure of a time axis compressing converter shown in FIG. 9.

The time axis compressing converter 6, one example of which is shown in FIG. 10, comprises an FIFO (First-in First-out) type memory 20, a write-in controller 21 for sequentially writing to the memory 20 time-sequential data $Q_i$ having a sampling frequency $3f_{sc}$ applied to a terminal 5 at the rate of the frequency $3f_{sc}$, a read-out controller 22 for reading out data from the memory 20 at the rate of a frequency $4f_{sc}$ while adding one dummy data $D_K$ every three read-out data, and outputting the combined data to a terminal 23 at the rate of the frequency $4f_{sc}$. The FIFO type memory 20 outputs data in the same order as that when the data are written thereto.

The read-out controller 22 stops its output operation for a time period of one clock $(T = \frac{1}{4}f_{sc})$ every time it receives three sequential digital data $Q_i$, to form one dummy data $D_k$ to add the read-out data $Q_i$. Thus, a time axis compressed data having one dummy data $D_k$ added every three applied data $Q_i$ is outputted from the read-out controller 22 at the rate of the frequency $4f_{sc}$. The stop of the output operation for a time period of one clock of the read-out controller 22 can be easily achieved by, for example, using a signal having the frequency of $4f_{sc}$ as a clock signal and using a counter or a ring counter resettable to zero every four clocks for outputting an active signal while the count value is 1 to 3, as shown in dotted lines in FIG. 10. Needless to say, it can be achieved in another structure. For example, a structure may be separately provided which produces one arbitrary data (previously set) every four clocks.

As the transversal type digital filter 12, a structure of an interpolating filter having 25 taps (see the equation (9)) is shown by way of example. The filter 12 comprises delay elements 7a to 7i connected in series which receive an output of the time axis compressing converter 6 to delay received data by a predetermined time, multipliers 8a to 8i for multiplying an output of each of the delay elements 7a to 7i by a predetermined impulse response (tap coefficient) $\beta_s = \pm 4, \pm 3, \pm 2, \pm 1, 0$), respectively, an adder 9 for summing up an output of each of the multipliers 8a to 8i, and a coefficient controller 11 for applying the corresponding tap coefficient $\beta_s$ to the multipliers 8a to 8i, respectively.

Each of the delay elements 7a to 7i delays applied data by a time period of one clock $(T = \frac{1}{4}f_{sc})$, to output the same.

The time-sequential data $P_j$ having the sampling frequency $4f_{sc}$ is applied to a terminal 10 from the adder 9.

Figures 11, 12:
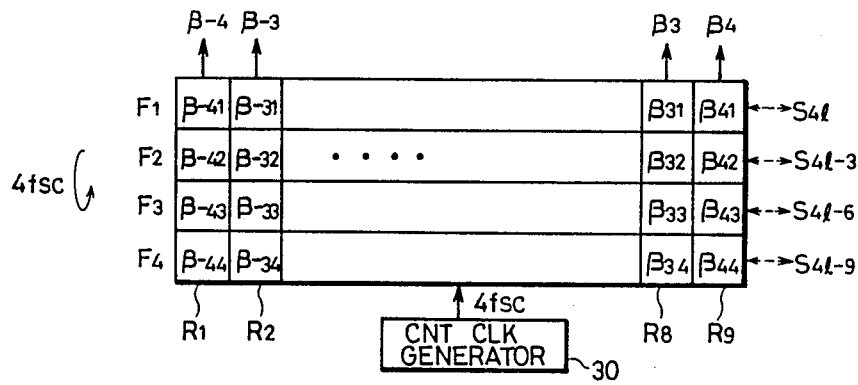
FIG. 11 is a diagram showing an example of a structure of a coefficient controller shown in FIG. 9.
FIG. 12 is a diagram showing the data flow in the sampling frequency converter according to one embodiment of the present invention.

The coefficient controller 11 outputs the tap coefficients $\beta_{-4}$ to $\beta_4$ for interpolating the applied digital data $Q_i$ as shown in the equation (9) with the added dummy data eliminated. As obvious from the equation (9), a set of the tap coefficients $\beta_{-4}$ to $\beta_4$ must be different for respective converted data $P_{4k}, P_{4k+1}, P_{4k+2}$ and $P_{4k+3}$. Thus, the coefficient controller 11 is structured by 9 circulating shift registers R1 to R9, for example, as shown in, FIG. 11. Each of the shift registers R1 to R9 stores four kinds of tap coefficient data. The contents of the shift registers R1 to R9 are applied to the corresponding multipliers 8a to 8i in parallel, and shifted (downward in FIG. 11) by one row every one clock $(T = \frac{1}{4}f_{sc})$. Thus, referring to FIG. 11, the contents F1, F2, F3 and F4 are sequentially outputted as tap coefficients $S_{4l}$ (for $P_{4k}$), $S_{4l-3}$ (for $P_{4k+1}$), $S_{4l-6}$ (for $P_{4k+2}$) and $S_{4l-9}$ (for $P_{4k+3}$), respectively. Switching of output data of each of the registers R1 to R9 and an operation of the digital filter 12 are controlled by a control clock generator 30 in synchronization with data output operation of the time axis compressing converter 6. Referring now to FIG. 12 showing the data flow, description is made on the operation of the sampling frequency converter shown in FIG. 9.

The time axis compressing converter 6 supplies the time axis compressed data (having a frequency $f_n = 4f_{sc}$) having one dummy data $D_k$ added every three applied digital data $Q_i$ to the digital filter 12 at the rate of the frequency $4f_{sc}$, as described above.

Figure 1:
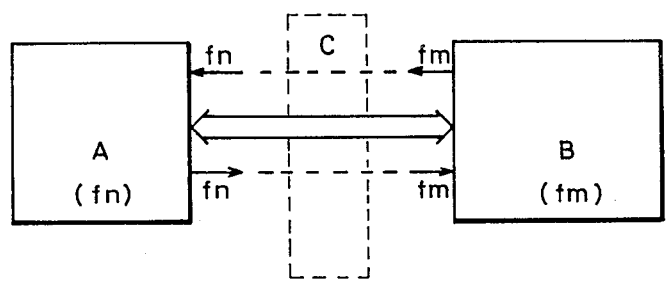
FIG. 1 is a diagram showing diagrammatically connection between devices for processing data having different sampling frequencies.
Figure 3A:
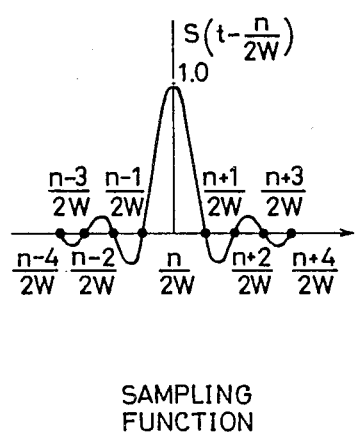
FIGS. 3A and 3B are diagrams showing a spectrum of a sampling function in the case of $T = \frac{1}{2}W$ and a method for recovering the original signal using the sampling function, respectively.
Figure 3B:
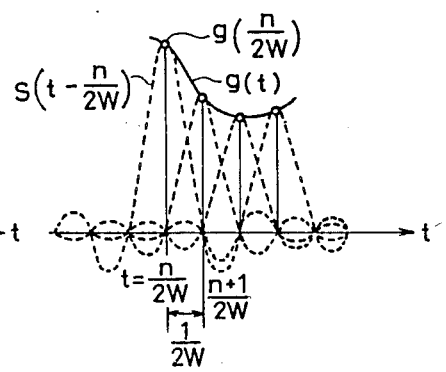
Figure 2A:
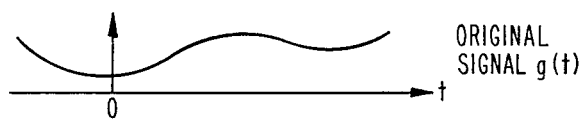
FIG. 2 is a diagram showing diagrammatically a system for sampling the original signal g(t) with a frequency $f_s (= 1/T)$.
Figure 2B:
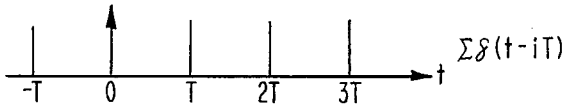
Figure 2C:
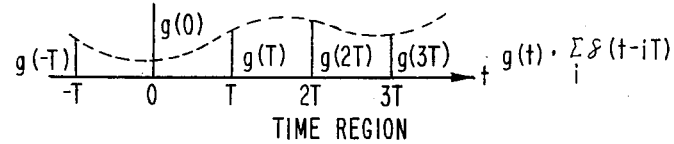
Figure 2D:
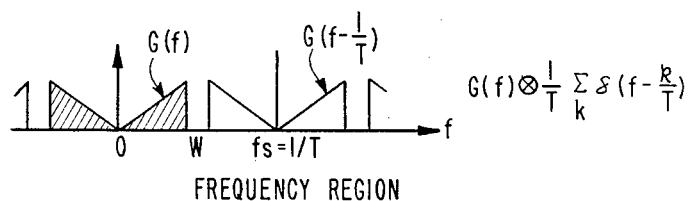
Figure 4A:
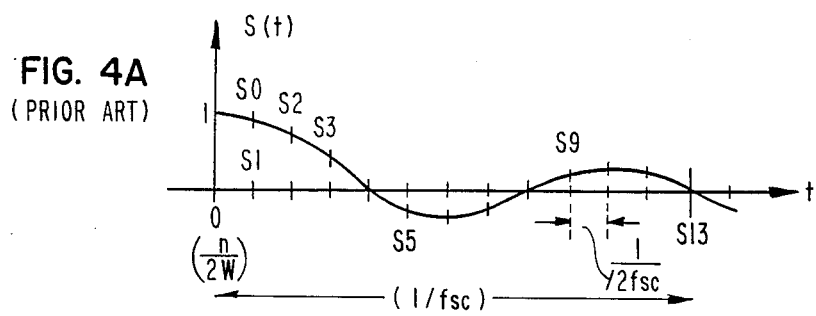
FIG. 4 is a diagram illustrating a method for converting the sampling frequency from $3f_{sc}$ to $4f_{sc}$.
Figure 4B:
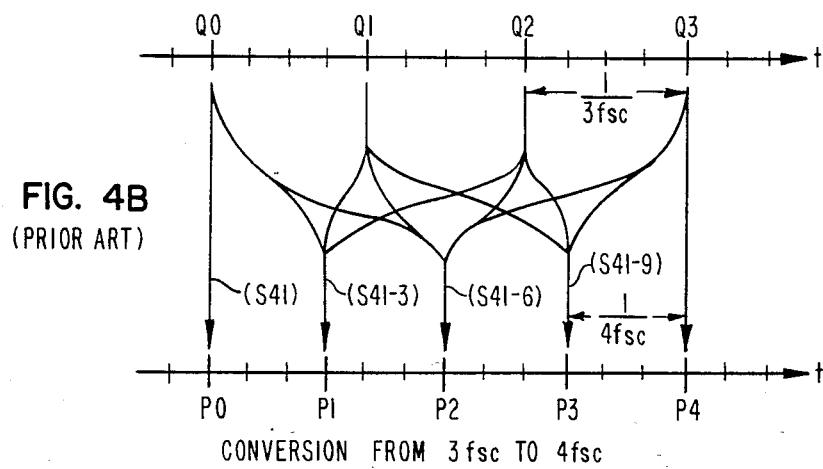
Figure 5:
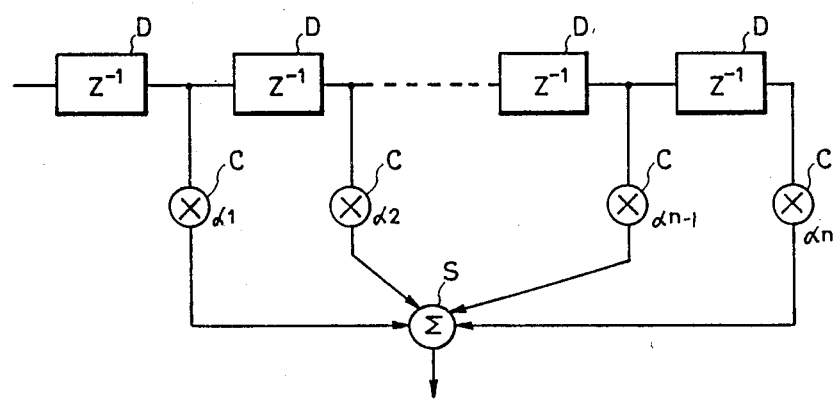
FIG. 5 is a diagram showing a general structure of a direct kind transversal filter.
Figure 6:
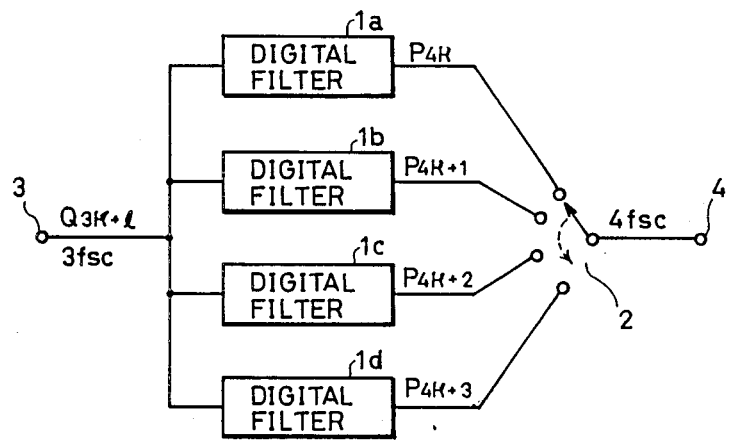
FIG. 6 is a diagram showing schematically a structure of a conventional sampling frequency converter.
Figure 7A:
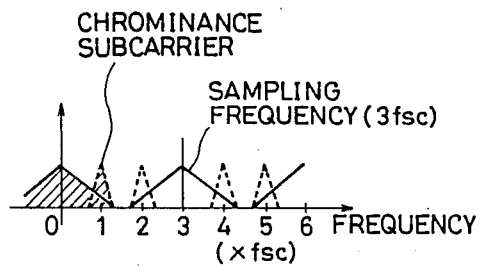
FIG. 7A shows a frequency spectrum in sampling with $3f_{sc}$.
Figure 7B:
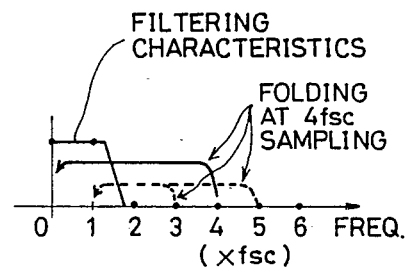
FIG. 7B shows required band characteristics of a filter and folding of a frequency component which appears in resampling with $4f_{sc}$ and FIG. 7C shows respective frequency characteristics of interpolating filters having tap coefficient of 13 and 25.
Figure 7C:
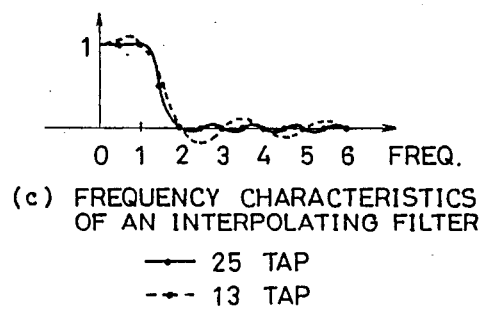
Figure 8:
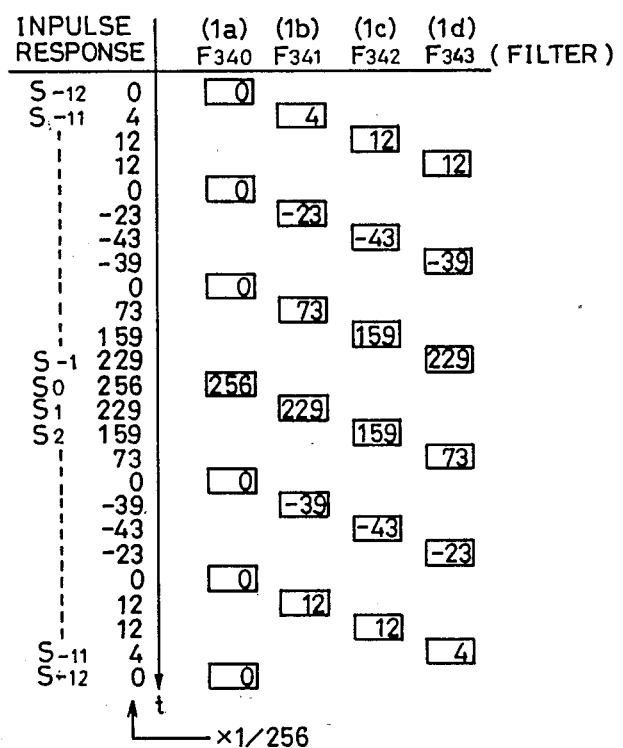
FIG. 8 is a diagram showing an example of an impulse response of an interpolating filter having 25 taps for converting a sampling frequency.

It is assumed that the digital filter 12 converts a sampling frequency equivalently by a 25th order interpolating filter, similarly to the filter of prior art shown in FIG. 6. In this case, the filter 12 receives, as time-sequential input data, time-sequential data having one dummy data $D_k$ inserted thereinto every three input data $Q_i$, as shown in FIG. 12(b). Thus, referring to the equation (9), dummy data are added between data $Q_{3k-1}$ and $Q_{3k}$, data $Q_{3k+2}$ and $Q_{3k+3}$ and after data $Q_{3k+5}$. Assuming that the dummy data are $D_{-1}, D_0, D_1$, the following equation (10) holds as an equation corresponding to the equation (9):

$$\begin{bmatrix} P_{4k} \\ P_{4k+1} \\ P_{4k+2} \\ P_{4k+3} \end{bmatrix} = \begin{bmatrix} S_{-12} & S_{-8} & S_{-4} & 0 & S_0 & S_4 & S_8 & 0 & S_{12} & 0 & 0 & 0 \\ 0 & S_{-11} & S_{-7} & 0 & S_{-3} & S_1 & S_5 & 0 & S_9 & 0 & 0 & 0 \\ 0 & 0 & S_{-10} & 0 & S_{-6} & S_{-2} & S_2 & 0 & S_6 & S_{10} & 0 & 0 \\ 0 & 0 & 0 & 0 & S_{-9} & S_{-5} & S_{-1} & 0 & S_3 & S_7 & S_{11} & 0 \end{bmatrix} \begin{bmatrix} Q_{3k-3} \\ Q_{3k-2} \\ Q_{3k-1} \\ D_{-1} \\ Q_{3k} \\ Q_{3k+1} \\ Q_{3k+2} \\ D_0 \\ Q_{3k+3} \\ Q_{3k+4} \\ Q_{3k+5} \\ D_1 \end{bmatrix} \quad (10)$$

Elements {0} in the fourth, eighth and twelfth columns are inserted to nullify the added dummy data.

Furthermore, when the equation (10) is transformed by using a Z operator in order to easily see the relation of data on the time axis in the equation (10), the following equation (11) holds between the time-sequential data Q' supplied to the filter 12 and the time-sequential data P' outputted therefrom as the data $P_j$ after conversion:

$$\begin{bmatrix} Z^{-3} \\ Z^{-2} \\ Z^{-1} \\ 1 \end{bmatrix} P' = \begin{bmatrix} \beta_{-4} & & & & & & & & \beta_4 & & & \\ S_{-12} & S_{-8} & S_{-4} & 0 & S_0 & S_4 & S_8 & 0 & S_{12} & 0 & 0 & 0 \\ 0 & S_{-11} & S_{-7} & 0 & S_{-3} & S_1 & S_5 & 0 & S_9 & 0 & 0 & 0 \\ 0 & 0 & S_{-10} & 0 & S_{-6} & S_{-2} & S_2 & 0 & S_6 & S_{10} & 0 & 0 \\ 0 & 0 & 0 & 0 & S_{-9} & S_{-5} & S_{-1} & 0 & S_3 & S_7 & S_{11} & 0 \end{bmatrix} \begin{bmatrix} Z^{-11} \\ Z^{-10} \\ Z^{-9} \\ Z^{-8} \\ Z^{-7} \\ Z^{-6} \\ Z^{-5} \\ Z^{-4} \\ Z^{-3} \\ Z^{-2} \\ Z^{-1} \\ 1 \end{bmatrix} Q' \quad (11)$$

In FIG. 12, data aligned in the vertical direction indicate respective output data of the delay elements 7a to 7i at an identical time. As obvious from FIG. 12, each of the delay elements 7a to 7i operates at the rate of the frequency $4f_{sc}$ in response to a clock having the frequency $4f_{sc}$ from a control signal generator for switching tap coefficients included in, for example, the tap coefficient control circuit 11 and in synchronization with a data output operation of the time axis compressing converter 6, and delays applied data by one clock (the frequency $4f_{sc}$ and thus, the delay time of $\frac{1}{4}f_{sc}$) to output the same. More specifically, data outputted from the converter 6 is shifted in the direction from the delay element 7a to the delay element 7i every one clock. If explained by the equations, this is as follows: it is assumed that data $P_0$ is outputted from the adder 9. In this case, the output data of the converter 6 is data $Q_4$ and the outputs of the delay elements 7a to 7i are data $Q_3$, $Q_2$, ..., $Q_{-2}$, $Q_{-3}$, respectively (see FIG. 12). On this occasion, it is necessary to use, as the tap coefficients, $S_{-12}$, $S_{-8}$, ..., 0, $S_{12}$) in the first row in the equation (11) as impulse responses (tap coefficients) $\beta_{-4}$ to $\beta_4$. Then, in order to find data $P_1$, it is necessary to use data $Q_i$ (i=3 to −3) in the same phase as that of data used in finding the data $P_0$. On this occasion, tap coefficients $\beta_4$ to $\beta_{-4}$ supplied from the coefficient control circuit 11 are switches to $F_2$ in FIG. 11, and, in synchronization of this tap coefficients switching, an output of each of the delay elements 7a to 7i is shifted for one delay element in the right direction in FIG. 9. Thus, the outputs of the delay elements 7a to 7i become $Q_{-2}$, $Q_{-1}$, ..., $Q_3$, $Q_4$, as shown in FIG. 12. Thus, in order to find data $P_1$, it is necessary to take elements ($S_{-11}$, $S_{-7}$, ... $S_9$, 0) in the second to tenth columns in the second row in the equation (11) as impulse responses (tap coefficients) $\beta_{-4}$ to $\beta_4$ relative to $P_1$, because it is considered that each element of the time-sequential data Q' is shifted one row downward in the equation (11). In the same manner, in order to find $P_2$ and $P_3$, it is necessary to use elements in the third to eleventh columns in the third row and elements in the fourth to twelfth columns in the fourth row are used as impulse responses (tap coefficients). In these cases, the added dummy data are nullified at the multipliers 8a to 8i where the dummy data are multiplied with tap coefficients of 0. Thus, four kinds (four rows) of [$S_{-12}$, $S_{-11}$, $S_{-10}$, 0], ..., [$S_{12}$, 0, 0, 0] are prepared for each of the tap coefficients $\beta_{-4}$ to $\beta_4$ as represented by broken lines in the equation (11). If the kinds of the tap coefficients are sequentially switched every one clock, the filter 12 is time-divisionally switched to four kinds of filters, and a term of dummy data is nullified, so that converted data $P_j$ having the sampling frequency $4f_{sc}$ is obtained at the output terminal 10.

More specifically, in the structure shown in FIG. 11 by way of example, if 9 circulating registers R1 to R9 are employed corresponding to the tap coefficients $\beta_{-4}$ to $\beta_4$ and four kinds of tap coefficient values [$S_{12}$, 0, 0,0], . . ., [$S_{-12}$, $S_{-11}$, $S_{-10}$, 0] are held in each of the registers R1 to R9 and an output of each of the registers R1 to R9 is switched every one clock (T=¼$f_{sc}$) in synchronization with the data output operation of the converter 6, tap coefficients required for conversion of the sampling frequency are obtained.

Thus, as shown in FIG. 12, when digital data $Q_0$, $Q_l$, . . . are sequentially inputted to the converter 6 at the rate of the sampling frequency 3$f_{sc}$, time-axis-compressed data $Q_{-3}$, $Q_{-2}$, $Q_{-1}$ $D_{-1}$, . . . are sequentially applied to the filter 12 from the converter 6 at the rate of the frequency 4$f_{sc}$. On this occasion, output data from the delay elements 7a to 7i change at the rate of the frequency 4$f_{sc}$ as shown in FIG. 12, and values of the tap coefficients data $\beta_{-4}$ and $\beta_4$ change at the rate of the frequency 4$f_{sc}$. As a result, an operation according to the equation (11) is performed in the filter 12, so that desired converted data $P_0$, $P_1$, $P_2$, . . . having the sampling frequency 4$f_{sc}$ are provided sequentially from the output terminal 10.

In the above described structure, a single filter in which tap coefficient data is switched every one clock of the frequency 4$f_{sc}$ is provided in place of the conventional four transversal filters 1a to 1d, and time-divisional and multiplexing processing of time axis compressed data including dummy data is performed by the single digital filter 12, so that a low-cost sampling frequency converter having a reduced number of parts and a simple circuit configuration is obtained.

In the above described embodiment, the sampling frequency is changed from $f_m$=3$f_{sc}$ to $f_n$=4$f_{sc}$. However, as long as the sampling frequencies $f_m$ and $f_n$ satisfy an integral ratio m:n (m<n, m, n; integer), the present invention is applicable to a structure in which the sampling frequency is converted from $f_m$ to $f_n$. In this case, the time axis compressing converter 6 adds (n−m) dummy data to the received data $Q_i$ every time m data $Q_i$ are inputted at the rate of the frequency $f_m$ to output the same at a frequency $f_n$, and the filter 12 switches the tap coefficient data at the rate of the frequency $f_n$, so that the filter 12 can time-divisionally perform a function as n digital filters, and desired converted data $P_j$ having the sampling frequency $f_n$ is obtained.

Additionally, although in the above described embodiment, the number of taps of the filter 12 is 9 based on the structure of the 25th order interpolating filter, the number of taps of the filter 12 can be set to a number other than 9, based on frequency characteristics required for the filter 12 and the required accuracy of conversion. In this case, it is necessary to change the number of the delay elements included in the filter 12 and the value of the tap coefficient data depending on the number of taps. However, even in such case, the number of taps and the values of the tap coefficients can be obtained using the method and/or concept in accordance with the present invention.

As described in the foregoing, according to the present invention, there are provided a time axis compressing converter for applying time axis compression of data having a sampling frequency m·f into data having a sampling frequency n·f (n>m), adding (n−m) dummy data for each m input data, and then outputting time-axis-compressed data having a frequency $f_n$ and a single digital filter for performing filter processing of interpolating and resampling an output from the time axis compressing converter in which tap coefficient data changes at the rate of the frequency $f_n$. Thus, a single filter functions as n different filters at the rate of the frequency $f_n$ in a time divisional manner, so that a low-cost sampling frequency converter provided with a single filter having a reduced number of parts and a simple configuration can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sampling frequency converter for converting first time-sequential data $Q_i$ obtained by sampling an analog signal at the rate of a first sampling frequency $f_m$ to second time-sequential data $P_j$ having a second sampling frequency $f_n$ ($f_m$:$f_n$=m:n, m<n, m, n: integer), comprising:

time axis converter means (6) receiving said first time-sequential data $Q_i$ for converting the same to a data stream having said second sampling frequency $f_n$ by adding (n−m) dummy data to said first time-sequential data $Q_i$ every time m said first time sequential data $Q_i$ are applied, to output the converted data stream, and means (12) having n kinds of tap coefficient data obtained based on impulse response data obtained by sampling a sampling function for said first sampling frequency $f_m$ at the rate of the least common multiple of said frequencies $f_n$ and $f_m$ for interpolating an output of said time axis converter means by using said tap coefficient data, said tap coefficient data being determined to eliminate the effect of said dummy data and being switched at the rate of said second sampling frequency $f_n$.

2. The sampling frequency converter according to claim 1, wherein said interpolating means comprises a plurality of delay means (7a–7i) connected in series, each of said delay means delaying applied data by a predetermined time period 1/$f_n$, tap coefficient control means (11) for outputting said n kinds of tap coefficient data in a circulating manner in a period 1/$f_n$, each of said n kinds of tap coefficient data having coefficient data corresponding to the number of said delay means, a plurality of multiplying means (8a–8i) for multiplying an output of each of said delay means by corresponding tap coefficient data from said tap coefficient control means, and adder means (9) for adding output of each of said plurality of multiplying means to output the same.

3. The sampling frequency converter according to claim 1, wherein said interpolating means equivalently functions as an interpolating filter having (2N+1) taps (N: integer), and said n kinds of tap coefficient data are obtained by inserting (n−m) 0s every m columns of said obtained impulse response data, where they are developed in a first matrix of n rows and N columns.

4. The sampling frequency converter according to claim 3, wherein n kinds of tap coefficient data outputted by said coefficient control means are represented by a second matrix having n row and K columns (K: actual number of taps of said interpolating filter) obtained by shifting a leading column by one column with respect to an immediately preceding row along the first row to the n-th row in said first matrix of n rows and N columns, each of said second column forming tap coefficient data applied to each of said multiplying means.

5. The sampling frequency converter according to claim 1, wherein said time axis converter means comprises
   a First-in First-out kind memory (20),
   a write-control means (21) for writing said first time-sequential data $Q_i$ in said memory at the rate of said first sampling frequency $f_m$ and,
   read-control means (22) for reading out data from said memory at the rate of said second sampling frequency $f_n$ and to be inactivated during (n−m) cycles of said second sampling frequency $f_n$ every time the number of read-out data from said memory becomes m.

6. The sampling frequency converter according to claim 2, wherein
   said tap coefficient control means comprises circulating shift registers (R1-R9) each having its output switched at the rate of said second sampling frequency $f_n$.

7. The sampling frequency converter according to claim 2, wherein
   said integral ratio m:n is 3:4.

8. The sampling frequency converter according to claim 7, wherein
the number of the delay means included in said interpolating means is 9.

9. A method for converting first time-sequential data $Q_i$ obtained by sampling an analog signal at the rate of a first sampling frequency $f_m$ to second time-sequential data $P_j$ having a second sampling frequency $f_n$ ($f_m:f_n=m:n$, $m<n$, m, n: integer), comprising the steps of:
   adding (n−m) dummy data to said first time-sequential data $Q_i$ every time m said first time-sequential data $Q_i$ are received to output the same at the rate of said second frequency $f_n$, and
   receiving said data outputted at the rate of said second sampling frequency $f_n$ and interpolating said received first time-sequential data $Q_i$ based on n kinds of impulse response data obtained by sampling a sampling function for said first sampling frequency $f_m$ at a frequency of the least common multiple of said first and second sampling frequencies $f_m$ and $f_n$ to output the same,
   said interpolating step in said second mentioned step comprising the step of operating a single transversal kind filter having delay elements at the rate of said second sampling frequency $f_n$,
   the step of operating said transversal kind filter comprising the step of sequentially outputting n kinds of tap coefficient data obtained by inserting (n−m) 0s to said impulse response data in a position corresponding to said dummy data at the rate of said second sampling frequency $f_n$ in a sequential and circulating manner.

* * * * *